US009129801B2

(12) United States Patent
Fleischhaker et al.

(10) Patent No.: US 9,129,801 B2
(45) Date of Patent: Sep. 8, 2015

(54) THERMALLY LABILE PRECURSOR COMPOUNDS FOR IMPROVING THE INTERPARTICULATE CONTACT SITES AND FOR FILLING THE INTERSTICES IN SEMICONDUCTIVE METAL OXIDE PARTICLE LAYERS

(75) Inventors: Friederike Fleischhaker, Ludwigshafen (DE); Imme Domke, Mannheim (DE); Andrey Karpov, Mannheim (DE); Marcel Kastler, Basel (CH); Veronika Wloka, Mannheim (DE); Lothar Weber, Bielefeld (DE)

(73) Assignee: BASF SE, Ludwigshafen (DE)

( * ) Notice: Subject to any disclaimer, the term of this patent is extended or adjusted under 35 U.S.C. 154(b) by 206 days.

(21) Appl. No.: 13/378,765

(22) PCT Filed: Jun. 15, 2010

(86) PCT No.: PCT/EP2010/058391
§ 371 (c)(1),
(2), (4) Date: Dec. 16, 2011

(87) PCT Pub. No.: WO2010/146053
PCT Pub. Date: Dec. 23, 2010

(65) Prior Publication Data
US 2012/0086002 A1    Apr. 12, 2012

(30) Foreign Application Priority Data
Jun. 16, 2009 (EP) .................................... 09162783

(51) Int. Cl.
| H01L 21/00 | (2006.01) |
| H01L 21/16 | (2006.01) |
| H01L 21/02 | (2006.01) |
| H01L 29/10 | (2006.01) |
| H01L 29/12 | (2006.01) |

(52) U.S. Cl.
CPC .... *H01L 21/02422* (2013.01); *H01L 21/02554* (2013.01); *H01L 21/02565* (2013.01); *H01L 21/02573* (2013.01); *H01L 21/02601* (2013.01); *H01L 21/02628* (2013.01)

(58) Field of Classification Search
None
See application file for complete search history.

(56) References Cited

U.S. PATENT DOCUMENTS

| 2004/0046168 A1 | 3/2004 | Andriessen |
| 2006/0284171 A1 | 12/2006 | Levy et al. |

(Continued)

FOREIGN PATENT DOCUMENTS

| WO | 2009 013291 | 1/2009 |
| WO | 2009 016107 | 2/2009 |

OTHER PUBLICATIONS

U.S. Appl. No. 13/379,247, filed Dec. 19, 2011, Riggs, et al.

(Continued)

*Primary Examiner* — Michael Jung
(74) *Attorney, Agent, or Firm* — Oblon, McClelland, Maier & Neustadt, L.L.P.

(57) ABSTRACT

The present invention relates to a process for producing a layer comprising at least one semiconductive metal oxide on a substrate, comprising at least the steps of:
(A) applying a porous layer of at least one semiconductive metal oxide to a substrate,
(B) treating the porous layer from step (A) with a solution comprising at least one precursor compound of the semiconductive metal oxide, such that the pores of the porous layer are at least partly filled with this solution and
(C) thermally treating the layer obtained in step (B) in order to convert the at least one precursor compound of the semiconductive metal oxide to the semiconductive metal oxide, wherein the at least one precursor compound of the at least one semiconductive metal oxide in step (B) is selected from the group consisting of carboxylates of mono-, di- or polycarboxylic acids having at least three carbon atoms or derivatives of mono-, di- or polycarboxylic acids, alkoxides, hydroxides, semicarbazides, carbamates, hydroxamates, isocyanates, amidines, amidrazones, urea derivatives, hydroxylamines, oximes, oximates, urethanes, ammonia, amines, phosphines, ammonium compounds, nitrates, nitrites or azides of the corresponding metal, and mixtures thereof.

15 Claims, 2 Drawing Sheets

(56) References Cited

U.S. PATENT DOCUMENTS

2010/0003203 A1* 1/2010 Karpov et al. ............. 424/59
2010/0120197 A1 5/2010 Levy et al.

OTHER PUBLICATIONS

U.S. Appl. No. 13/809,496, filed Jan. 10, 2013, Koehler, et al.
Hilgendorff, M., et al., "From ZnO Colloids to Nanocrystalline Highly Conductive Films," Journal of the Electrochemical Society, vol. 145, No. 10, pp. 3632-3637, (Oct. 1, 1998).
Sun, B., "Low-Temperature Sintering of In-Plane Self-Assembled ZnO Nanorods for Solution-Processed High-Performance Thin Film Transistors," The Journal of Physical Chemistry, vol. 111, pp. 18831-18835, (Dec. 4, 2007).
International Search Report Issued Oct. 18, 2010 in PCT/EP10/58391 Filed Jun. 15, 2010.
U.S. Appl. No. 13/266,935, filed Oct. 28, 2011, Karpov, et al.

* cited by examiner

THERMALLY LABILE PRECURSOR COMPOUNDS FOR IMPROVING THE INTERPARTICULATE CONTACT SITES AND FOR FILLING THE INTERSTICES IN SEMICONDUCTIVE METAL OXIDE PARTICLE LAYERS

The present invention relates to a process for producing a layer comprising at least one semiconductive metal oxide on a substrate, comprising at least the steps of (A) applying a porous layer of at least one semiconductive metal oxide to a substrate, (B) treating the porous layer from step (A) with a solution comprising at least one precursor compound of the semiconductive metal oxide, such that the pores of the porous layer are at least partly filled with this solution and (C) thermally treating the layer obtained in step (B) at a temperature of 10 to 200° C. in order to convert the at least one precursor compound of the semiconductive metal oxide to the semiconductive metal oxide, wherein the at least one precursor compound of the at least one semiconductive metal oxide in step (B) is selected from the group consisting of carboxylates of mono-, di- or polycarboxylic acids having at least three carbon atoms or derivatives of mono-, di- or polycarboxylic acids, alkoxides, hydroxides, semicarbazides, carbamates, hydroxamates, isocyanates, amidines, amidrazones, urea derivatives, hydroxylamines, oximes, oximates, urethanes, ammonia, amines, phosphines, ammonium compounds, nitrates, nitrites or azides of the corresponding metal, and mixtures thereof, to the substrate thus producible and to the use of the substrate in electronic components. More particularly, the present invention relates to a process for treating porous layers of semiconductive metal oxide particles on appropriate substrates using a solution comprising appropriate precursor compounds, in order to at least partly fill the interstices between the metal oxide particles and to better connect the metal oxide particles to one another.

Processes for producing semiconductive metal oxide layers, in which initially present voids between the particles are at least partly filled with semiconductive material, or particles are subsequently "welded" to one another, are already known from the prior art.

U.S. 2006/0284171 A1 discloses a process for producing a thin-film transistor comprising a zinc oxide-based semiconductive material. The process according to U.S. 2006/0284171 A1 comprises the application of a porous zinc oxide nanoparticle layer to an appropriate substrate, followed by the application of a solution comprising a zinc oxide precursor compound to this porous layer in order to at least partly close the pores. Subsequently, the layer produced is dried and converted to the corresponding semiconductive material at a temperature of at least 50° C. Suitable precursor compounds for this process are zinc acetylacetonate, zinc bromide, zinc hydroxide, zinc chloride or zinc nitrate. Preference is given to using zinc acetate.

B. Sun et al., *The Journal of Physical Chemistry C Letters*, 2007, 111, 18831 to 18835, disclose a process for producing a coating of zinc oxide on suitable substrates. This process comprises the application of a layer of zinc oxide nanotubes to the substrate, followed by the coating of this first layer with a solution comprising a precursor compound. Finally, the precursor compound is converted to the corresponding semiconductive material by heating. The precursor compound used is zinc acetate.

The processes known from the prior art for applying semiconductive layers based on particulate systems to appropriate substrates generally have the disadvantage that porous layers are initially obtained, in which interstices and few or poor connections are present between the individual nanoparticles, and so the mechanical and/or electrical properties of these semiconductive layers are inadequate or still in need of improvement. The processes known from the prior art for subsequently applying a solution of a zinc oxide precursor compound to this porous layer in order to at least partly close the pores or to bring the particles into better contact with one another have the disadvantage that the precursor compounds used, for example zinc acetate, can be converted to zinc oxide without residue only at relatively high temperature. A process which is performable at relatively low temperatures is needed in order also to be able to use heat-sensitive substrates, for example polymers.

It is an object of the present invention to provide a process with which layers of semiconductive material on substrates can be treated with a precursor solution which can be decomposed at low temperatures, for example below 200° C., to corresponding metal oxides in order thus to fill the interstices of the layers at least partly with metal oxide, and to enlarge the contact areas between the individual particles. It is a further object of the present invention to obtain corresponding semiconductive layers in this way, which feature a particularly high mechanical stability and particularly good electronic properties. A process in which such a solution is applied to a porous metal oxide layer produced beforehand, penetrates into the pores and decomposes there to the corresponding metal oxide by heating shall be provided. In addition, the process shall be very simple to perform.

These objects are achieved by the process according to the invention for producing a layer comprising at least one semiconductive metal oxide on a substrate, comprising at least the steps of:

(A) applying a porous layer of at least one semiconductive metal oxide to a substrate, (B) treating the porous layer from step (A) with a solution comprising at least one precursor compound of the semiconductive metal oxide, such that the pores of the porous layer are at least partly filled with this solution and (C) thermally treating the layer obtained in step (B) in order to convert the at least one precursor compound of the semiconductive metal oxide to the semiconductive metal oxide, wherein the at least one precursor compound of the at least one semiconductive metal oxide in step (B) is selected from the group consisting of carboxylates of mono-, di- or polycarboxylic acids having at least three carbon atoms or derivatives of mono-, di- or polycarboxylic acids, alkoxides, hydroxides, semicarbazides, carbamates, hydroxamates, isocyanates, amidines, amidrazones, urea derivatives, hydroxylamines, oximes, oximates, urethanes, ammonia, amines, phosphines, ammonium compounds, nitrates, nitrites or azides of the corresponding metal, and mixtures thereof.

The process according to the invention serves to produce a layer comprising at least one semiconductive metal oxide on a substrate.

According to the invention, "pores" are understood to mean the depressions, voids and interstices between the particles of at least one semiconductive metal oxide applied in step (A) of the process according to the invention.

In a preferred embodiment, the at least one semiconductive metal oxide is selected from the group consisting of zinc oxide, tin oxide, aluminum oxide, gallium oxide, indium oxide and mixtures thereof. In a particularly preferred embodiment, zinc oxide is used as the semiconductive metal oxide in the process according to the invention. The present invention therefore also relates to the process according to the invention wherein the at least one semiconductive metal oxide is zinc oxide ZnO.

In general, it is possible by the process according to the invention to coat all substrates known to those skilled in the art, for example Si wafers, glass, ceramics, metals, metal oxides, semimetal oxides, polymers, preferably flexible, such as polyethylene terephthlalate (PET), polyethylene naphthalate (PEN), polycarbonates, polyacrylates, polystyrenes, polysulfones, polyimides, etc. By virtue of the fact that solutions which comprise precursor compounds which decompose at particularly low temperatures are used in accordance with the invention, it is possible also to use substrates which would be deformed and/or thermally damaged at higher temperatures.

In a particularly preferred embodiment of the process according to the invention, the substrate comprises at least one polymer, for example selected from the group consisting of polyesters, for example polyethylene terephthalate (PET), polyethylene naphthalate (PEN), polycarbonates, polysulfones, polyimides and mixtures thereof.

The layer which is produced on the substrate by the process according to the invention and comprises at least one semiconductive metal oxide generally has a thickness of 10 to 2000 nm, preferably 30 to 500 nm.

In a preferred embodiment, the layer produced in accordance with the invention is less porous and has better electrical properties, for example higher mobilities in a thin-film transistor (TFT) than the porous metal oxide layer produced without steps B) and C) or a corresponding metal oxide layer according to the prior art. The lower porosity of the layer formed in accordance with the invention can be analyzed, for example, by microscope images.

Figure 1:
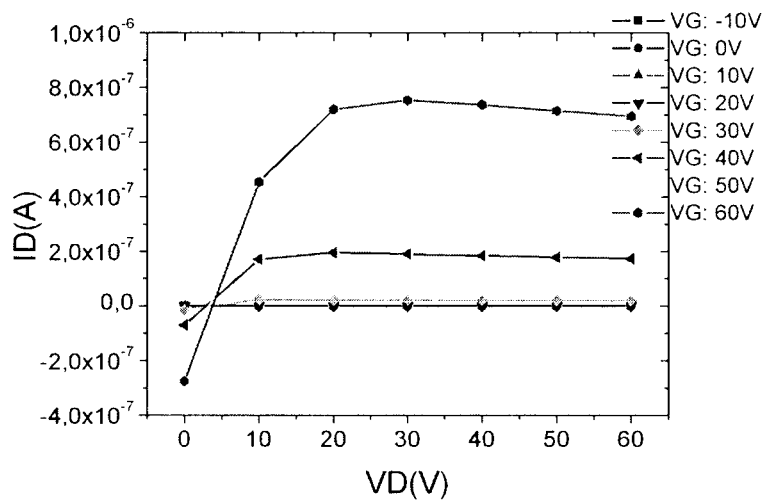
FIGS. 1 and 2 show representative output curves (OK) and transfer curves (TK) of the TFTs.

The individual steps of the process according to the invention are described in detail hereinafter:

Step (A):

Step (A) of the process according to the invention comprises the application of a porous layer of at least one semiconductive metal oxide to a substrate. Suitable semiconductive metal oxides and substrates are specified above.

In general, in step (A), it is possible to use all methods known to those skilled in the art for applying a porous layer of at least one semiconductive metal oxide to a substrate, for example application of solutions or dispersions to appropriate substrates, for example by spin-coating, spray-coating, dip-coating, drop-casting or printing, for example inkjet printing, flexographic printing or gravure printing.

It is possible in accordance with the invention to apply the at least one semiconductive metal oxide to the substrate as such. In addition, it is possible in accordance with the invention that solutions of appropriate precursor compounds of the at least one semiconductive metal oxide are applied to the substrate, and then converted to the semiconductive metal oxide. The precursor compounds can be converted to semiconductive metal oxides by processes known to those skilled in the art, for example by thermal treatment.

In addition, it is possible to apply appropriate particulate semiconductive materials, especially semiconductive metal oxides, more preferably zinc oxide, in particulate form to appropriate substrates, for example by application of a dispersion of these particles, for example by spin-coating, spray-coating, dip-coating, drop-casting or printing, for example inkjet printing, flexographic printing or gravure printing.

The at least one semiconductive material is applied in step (A) of the process according to the invention preferably in particulate form. The individual particles generally have a diameter of 3 nm to 1 µm, preferably 5 nm to 100 nm. The particles may be present on the substrate in any form known to those skilled in the art, especially as spherical particles and/or rod-shaped particles and/or platelet-shaped particles. The present invention therefore also relates to the process according to the invention wherein the porous layer of at least one semiconductive metal oxide in step (A) comprises spherical particles and/or rod-shaped particles and/or platelet-shaped particles.

The at least one semiconductive metal oxide applied to a substrate in step (A) of the process according to the invention may optionally be doped with suitable dopants, for example selected from the group consisting of $Al^{3+}$, $In^{3+}$, $Ga^{3+}$, $Sn^{4+}$ and mixtures thereof.

The present invention therefore also relates to the process according to the invention wherein the at least one semiconductive metal oxide has been doped with metal cations selected from the group consisting of $Al^{3+}$, $In^{3+}$, $Ga^{3+}$, $Sn^{4+}$ and mixtures thereof.

These metal cations added for doping are incorporated into the crystal lattice of the at least one semiconductive metal oxide and impart n- or p-semiconductive character to the semiconductive metal oxide.

Processes for doping the layer applied in step (A) are known per se to those skilled in the art. In the embodiment of the process according to the invention in which the layer is applied in step (A) by applying a solution or dispersion of precursor compounds to the substrate and subsequent thermal treatment, appropriate precursor compounds of the dopant can be added to this solution or dispersion. When step (A) of the process according to the invention is effected by applying particles, the dopants can be introduced into them in the course of production of the particles, for example by adding appropriate salts to the solutions or dispersions used in the production of the particles.

The precursor compounds of the dopants mentioned can be added in the form of metal oxides, metal hydroxides, metal alkoxides, metal nitrates or in the form of soluble complexes of the appropriate cations. The dopants can be added to the particles in step (A) of the process according to the invention generally in an amount of 0.1-10 mol % based on Zn, preferably 0.1-5 mol % based on Zn.

In step (A), a substrate is obtained, on which there is a porous layer of at least one semiconductive metal oxide, especially in the form of spherical particles and/or rod-shaped particles and/or platelet-shaped particles.

Step (B):

Step (B) comprises the treatment of the porous layer from step (A) with a solution comprising at least one precursor compound of the semiconductive metal oxide, such that the pores of the porous layer are filled at least partly with this solution. It is a particular feature of the process according to the invention that the at least one precursor compound of the at least one semiconductive metal oxide in step (B) is selected from the group consisting of carboxylates of mono-, di- or polycarboxylic acids having at least three carbon atoms or derivatives of mono-, di- or polycarboxylic acids, alkoxides, hydroxides, semicarbazides, carbamates, hydroxamates, isocyanates, amidines, amidrazones, urea derivatives, hydroxylamines, oximes, oximates, urethanes, ammonia, amines, phosphines, ammonium compounds, nitrates, nitrites or azides of the corresponding metal, and mixtures thereof.

In step (B) of the process according to the invention, preference is given to using a solution of the corresponding precursor compound. The solvent used is therefore preferably a solvent in which the precursor compounds used are soluble to an extent of at least 0.01% by weight, based on the overall solution.

Particularly suitable solvents are, for example, selected from the group consisting of water, alcohol, for example methanol, ethanol, isopropanol, n-propanol, n-butanol, isobutanol, tert-butanol, ketones, for example acetone, ethers, for example diethyl ether, methyl tert-butyl ether, tetrahydrofuran, dioxane, dimethoxyethane, esters and mixtures thereof. Preference is given to using, in step (B) of the process according to the invention, aqueous, alcoholic or ethereal solutions; particular preference is given to using water as the solvent in step (B).

In step (B) of the process according to the invention, a solution which comprises the at least one precursor compound of the at least one semiconductive metal oxide is used in a concentration of 0.01 to 20% by weight, preferably 0.1 to 10% by weight, more preferably 0.5 to 5% by weight, based in each case on the overall solution.

In step (B) of the process according to the invention, at least one precursor compound of the at least one semiconductive metal oxide is used in the appropriate solvent. The at least one precursor compound of the at least one metal oxide is selected from the group consisting of carboxylates of mono-, di- or polycarboxylic acids having at least three carbon atoms, or derivatives of mono-, di- or polycarboxylic acids, alkoxides, hydroxides, semicarbazides, carbamates, hydroxamates, isocyanates, amidines, amidrazones, urea derivatives, hydroxylamines, oximes, oximates, urethanes, ammonia, amines, phosphines, ammonium compounds, nitrates, nitrites or azides of the corresponding metal, and mixtures thereof.

In a preferred embodiment, precursor compounds which decompose at a temperature of generally 10 to 200° C., preferably 20 to 150° C., more preferably 30 to 130° C., most preferably 40 to 100° C., to the semiconductive metal oxide and volatile products, for example carbon dioxide, ethyl acetate, acetone, ammonia, etc. are used. A minimum temperature for the decomposition of these precursor compounds is, for example, 50° C., or, for example, 20° C. with catalytic activation.

Suitable carboxylates of the corresponding metal are, for example, compounds of the corresponding metal with mono-, di- or polycarboxylic acids with at least three carbon atoms or derivatives of mono-, di- or polycarboxylic acids. According to the invention, derivatives of mono-, di- or polycarboxylic acids are understood to mean the corresponding mono-, di- or polyesters, or anhydrides or amides. According to the invention, the metal atom present as the central atom in the carboxylate complexes may generally have the coordination numbers of 3 to 6.

In the case which is particularly preferred in accordance with the invention, that zinc oxide is applied to the substrate as the semiconductive metal oxide, in step (B), the preferred carboxylates used are corresponding compounds of zinc. In a preferred embodiment, according to the invention, zinc carboxylate complexes with coordination numbers 3 to 6 are used, at least one ligand on the zinc originating from the group of the mono-, di- or polycarboxylic acids having at least three carbon atoms or derivatives of mono-, di- or polycarboxylic acids.

In a further preferred embodiment, the precursor compounds used are zinc carboxylates or derivatives thereof which decompose at a temperature of generally 10 to 200° C., preferably 20 to 150° C., more preferably 30 to 130° C., most preferably 40 to 100° C., to zinc oxide and volatile products, for example carbon dioxide, acetone, etc. A minimum temperature for the decomposition of these precursor compounds is, for example, 50° C., or, for example, 20° C. with catalytic activation.

Particularly preferred carboxylates used as precursor compounds in step (B) of the process according to the invention correspond to the general formula (I)

$$R^1\text{-M-O-C(O)-R}^2 \qquad (I)$$

where
M is Zn
$R^1$ is hydrogen, linear or branched $C_1$-$C_{12}$-alkyl, linear or branched $C_1$-$C_{12}$-heteroalkyl, substituted or unsubstituted $C_5$-$C_{16}$-aryl, linear or branched, substituted or unsubstituted $C_5$-$C_{16}$-aralkyl, linear or branched, substituted or unsubstituted $C_5$-$C_{16}$-alkaryl, $NR^6R^7$ where $R^6$, $R^7$ are each independently Si—($C_1$-$C_6$-alkyl)$_3$ or the radical of the formula —O—C(O)—$R^2$ with the definitions of $R^2$ given below, in each case optionally substituted by functional groups with electron donor character, for example hydroxyl, amino, alkylamino, amido, ether and/or oxo,
$R^2$ is linear or branched $C_1$-$C_{12}$-alkyl, preferably $C_2$-$C_{12}$-alkyl, linear or branched $C_1$-$C_{12}$-heteroalkyl, preferably $C_2$-$C_{12}$-heteroalkyl, substituted or unsubstituted $C_5$-$C_{16}$-aryl, linear or branched, substituted or unsubstituted $C_5$-$C_{16}$-aralkyl, linear or branched, substituted or unsubstituted $C_5$-$C_{16}$-alkaryl, in each case optionally substituted by functional groups with electron donor character, for example hydroxyl, amino, alkylamino, amido, ether and/or oxo; or radicals of the formula

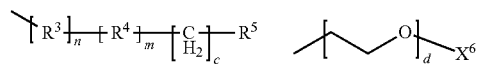

$R^3$ is selected from O and $CH_2$,
n, m, c are each independently 0, 1, 2 or 3, preferably 0, 1, 2, and more preferably 0 or 1,
$R^4$ is selected from O, C=O, —$X^4$C=CH—, $OCH_2$,
$R^5$ is selected from H, OH, $OCH_3$, $OC_2H_5$, $OSi(X^1)_{(3-a-b)}(X^2)_a(X^3)_b$, $CO_2X^5$, $OCO_2X^5$, preferably from $CO_2X^5$,
$X^5$ is selected from $C_1$ to $C_4$ alkyl, preferably from methyl, ethyl and tert-butyl, most preferably from ethyl and tert-butyl,
a, b are each independently 0, 1, 2 or 3 and the sum of a and b is not more than 3,
$X^1, X^2, X^3, X^4$ are each independently selected from H, $C_1$ to $C_{10}$ alkyl, preferably H and $C_1$ to $C_4$ alkyl, more preferably H, methyl and ethyl,
d is an integer from 1 to 100,
$X^6$ is selected from H, $C_1$ to $C_{10}$ alkyl, preferably from H and $C_1$ to $C_4$ alkyl, more preferably selected from methyl and ethyl.

The compounds of the general formula (I) may be present in solution, preferably in aqueous solution, in the form of agglomerates or polycyclic adducts of two or more molecules of the general formula (I), which are likewise encompassed by the invention.

Ligands present in very particularly preferred carboxylates, especially zinc carboxylates, are selected from the group consisting of monoalkyl 3-oxoglutarates, for example monomethyl 3-oxoglutarate, monoethyl 3-oxoglutarate, monoalkyl malonates, for example monomethyl malonate, monoethyl malonate, and mixtures thereof.

A preferred example of a zinc carboxylate which is used in step (B) of the process according to the invention as a precursor compound is the compound of the formula (II) $Zn[(EtOC(O)CH_2C(O)CH_2COO)_2]$.

In the compounds reproduced as empirical and/or structural formulae in the present invention, solvent molecules, for example water, may possibly be present in the compounds.

Processes for preparing the compound of the formula (II) are known per se to those skilled in the art, for example by reaction of a stoichiometric amount of monoethyl 3-oxoglutarate with diethylzinc in hexane at 0° C.

A further particularly preferred example of a zinc carboxylate which is used in step (B) of the process according to the invention as a precursor compound, and which is present as an adduct of two molecules of the general formula (I), is the compound of the formula (III)

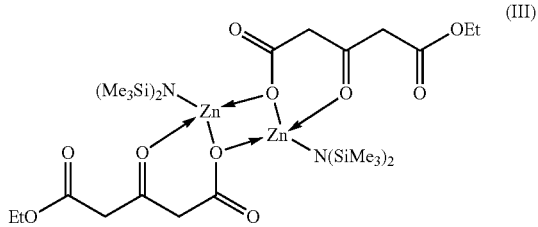

(III)

The compound of the formula (III) is likewise preparable by processes known to those skilled in the art, for example by reaction of an equimolar amount of monoethyl 3-oxoglutarate and zinc bis[bis(trimethylsilyl)amide] in benzene or toluene at room temperature.

A further particularly preferred example of a zinc carboxylate which is used in step (B) of the process according to the invention as a precursor compound is the compound of the formula (IV)

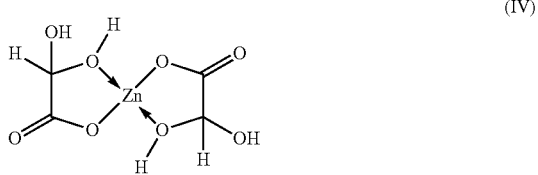

(IV)

The compound of the formula (IV) is likewise preparable by processes known to those skilled in the art.

A further preferred example of a zinc carboxylate is the compound of the formula (IVa) $Zn[(NH_2CH_2COO)_2(H_2O)]$ with electron donor functionality

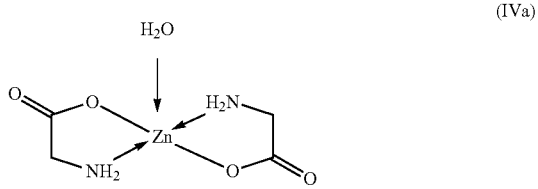

(IVa)

A further particularly preferred example of a zinc carboxylate which is used in step (B) of the process according to the invention as a precursor compound is the compound of the formula (IV b) $Zn[\{R^7R^8N-N=C(CH_3)CO_2\}_2 (H_2O)_2]$, likewise with electron donor functionality in the alpha position to the carboxylate group.

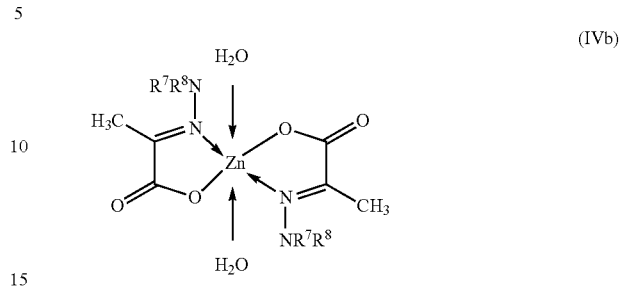

(IVb)

A further preferred example of a zinc carboxylate is the compound of the formula (IVc)

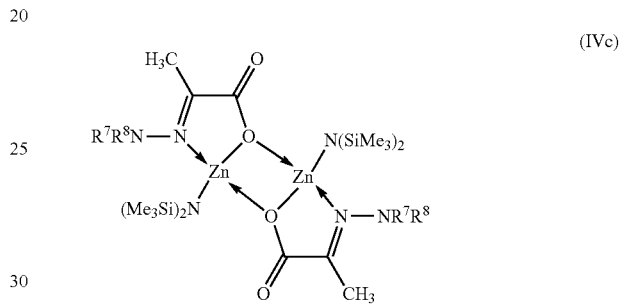

(IVc)

where $R^7=R^8$=methyl, or $R^7$=H and $R^8$=C(O)Me.

Additionally preferably, in step (B) of the process according to the invention, the precursor compound of the at least one metal oxide used is an alkoxide of the corresponding metal.

Preference is given to using metal alkoxides as precursor compounds, in which the metal atom has the coordination number of 3 to 6. In the particularly preferred case that zinc oxide is used as the semiconductive metal oxide, especially zinc alkoxide complexes with coordination numbers of 3 to 6 are used, in which at least one ligand is an alkoxide. These coordination numbers present in accordance with the invention are achieved in the precursor compounds used in accordance with the invention by additions of identical or different molecules to one another.

In a particularly preferred embodiment, the precursor compounds used are zinc alkoxides which decompose at a temperature of generally 10 to 200° C., preferably 20 to 150° C., more preferably 30 to 130° C., most preferably 40 to 100° C., to the semiconductive metal oxide and volatile products. A minimum temperature for the decomposition of these precursor compounds is, for example, 50° C., or, for example, 20° C. with catalytic activation.

In a particularly preferred embodiment, the metal alkoxides used as precursor compounds in step (B) of the process according to the invention correspond to the following general formula (V))

(V)

where
M is Zn
$R^9$ is linear or branched $C_1$-$C_{12}$-alkyl, linear or branched $C_1$-$C_{12}$-heteroalkyl, substituted or unsubstituted $C_5$-$C_{16}$-aryl, linear or branched, substituted or unsubstituted $C_5$-$C_{16}$-aralkyl, linear or branched, substituted or unsubstituted $C_5$-$C_{16}$-alkaryl, preferably linear or branched $C_1$-$C_6$-alkyl, especially methyl or ethyl, in each case optionally substituted by functional groups with electron donor character, for example hydroxyl, amino, alkylamino, amido, ether and/or oxo, $R^{10}$ is hydrogen, linear or branched $C_1$-$C_{12}$-alkyl, linear or branched $C_1$-$C_{12}$-heteroalkyl, substituted or unsubstituted $C_5$-$C_{16}$-aryl, linear or branched, substituted or unsubstituted $C_5$-$C_{16}$-aralkyl, linear or branched, substituted or unsubstituted $C_5$-$C_{16}$-alkaryl, $NR^{11}R^{12}$ where $R^{11}$, $R^{12}$ are each independently Si—$(C_1$-$C_6$-alkyl$)_3$, or the radical of the formula —O—C(O)—$R^2$ with the above-specified definitions of $R^2$, in each case optionally substituted by functional groups with electron donor character, for example hydroxyl, amino, alkylamino, amido, ether and/or oxo; $R^9$ is more preferably linear or branched $C_1$-$C_6$-alkyl, especially methyl or ethyl, o is 1 or 2 and p is 0 or 1, where the indices are selected such that o+p=2, such that electrically uncharged compounds of the general formula (V) are present, or heterocubanes, for example (Et-Zn—OEt)$_4$ or $Zn_7O_8Me_{14}$ (formula (Vb)).

Particularly preferred compounds of the general formula (V) are methoxymethylzinc or ethoxyethylzinc.

Further preferred examples of zinc alkoxides which are used as a precursor compound in step (B) of the process according to the invention are the compounds of the formulae (Va), (Vb) and (Vc)

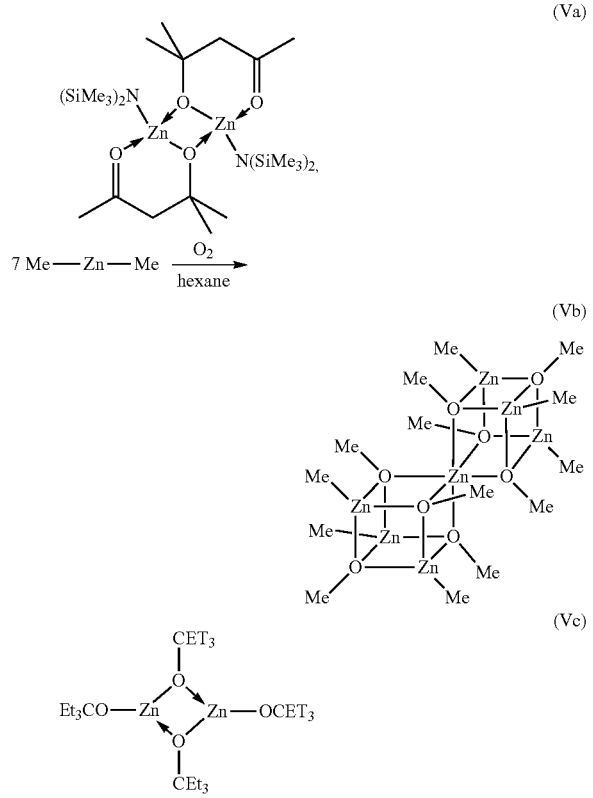

In a further preferred embodiment of the process according to the invention, the at least one precursor compound of the at least one metal oxide used is a hydroxide, semicarbazide, carbamate, hydroxamate, isocyanate, amidine, amidrazone, urea derivative, hydroxylamine, oxime, oximate, urethane, ammonia, amine, amide, phosphine, ammonium compound, azide, nitrate or nitrite of the corresponding metal or a mixture thereof, more preferably a hydroxo complex of the corresponding metal.

Preference is given to using hydroxo-metal complexes or else aquo complexes as precursor compounds, in which the metal atom has the coordination number of 4 to 6. In the particularly preferred case that zinc oxide is used as the semiconductive metal oxide, especially zinc complexes with coordination numbers of 4 to 6 are used.

In a particularly preferred embodiment, the precursor compounds used are hydroxo-metal complexes which decompose at a temperature of generally 10 to 200° C., preferably 20 to 150° C., more preferably 30 to 130° C., most preferably 40 to 100° C., to the semiconductive metal oxide and volatile products, for example ammonia. A minimum temperature for the decomposition of these precursor compounds is, for example, 50° C., or, for example, 20° C. with catalytic activation.

In a particularly preferred embodiment, these compounds correspond to the general formula (VI)

where

A, B, C are each independently $R^{13}_3N$ where each $R^{13}$ is independently hydrogen, $C_1$-$C_6$-alkyl, $C_5$-$C_{12}$-aryl, $C_5$-$C_{12}$-aralkyl, $C_5$-$C_{12}$-alkaryl, $N_2R^{13}_4$ where $R^{13}$ is as defined above, $NR^{13}_2OH$ where $R^{13}$ is as defined above, $(NR^{13}_2)_2C=O$ where $R^{13}$ is as defined above, $R^{13}N—CO_2^-$ where $R^{13}$ is as defined above, $N_3^-$, $NCO^-$, acetohydrazides, amidrazones, semicarbazides, $R^{14}_3P$ where each $R^{14}$ is independently hydrogen, methyl or ethyl, $R^{14}_3As$ where $R^{14}$ is as defined above, oximes, urethanes, tetrahydrofuran (THF), diformamide, dimethylformamide (DMF), acetone, water, $C_1$-$C_{12}$-alcohols, ethers having 2 to 12 carbon atoms, for example 1,2-dimethoxyethane (DME), cyclic ethers having 4 to 12 carbon atoms, for example dioxane, especially $NH_3$, q, r, s, t are each independently 0-10, preferably 0-6, more preferably 0-4, preferably t=2, u is 1-10, preferably u=1, where q, r, s, t, u are selected such that electrically uncharged compounds of the general formula (VI) are present.

Particular preference is given to using, in step (B) of the process according to the invention, as the at least one precursor compound, the inorganic complex $[(OH)_x(NH_3)_yZn]_z$ where x, y and z are each independently 0.01 to 10, most preferably $[(OH)_x(NH_3)_yZn]_z$ where x=2, y=2 or 4 and z=1, where x, y and z are selected such that the complex specified is electrically uncharged.

According to the invention, this precursor compound used with preference can be prepared by all processes known to those skilled in the art, for example reaction of zinc nitrate with sodium hydroxide solution and subsequent treatment with ammonia, for example described in S. Meiers et al, J. Am. Chem. Soc., 130(51), 2008, 17603-17609.

In a particularly preferred embodiment, in step (B) of the process according to the invention, the abovementioned inorganic complex $[(OH)_x(NH_3)_yZn]_z$ is used as the at least one precursor compound, and is obtained by direct reaction of zinc oxide or zinc hydroxide with ammonia, for example described in European patent application 09 158 896.2.

The present invention therefore especially also relates to the process according to the invention wherein $[(OH)_x(NH_3)_yZn]_z$ where x, y and z are each independently 0.01 to 10, such that the complex specified is electrically uncharged, is used as at least one precursor compound of the at least one metal oxide in step (B), and said complex is more preferably obtained by reacting zinc oxide or zinc hydroxide with ammonia.

The amount of precursor compound which is applied in step (B) of the process according to the invention to the porous layer obtained in step (A) is determined by the person skilled in the art such that, depending on the thickness of the layer obtained in step (A), the porosity thereof, the size of the pores, etc., a sufficient amount of the appropriate precursor compound is present in the pores that at least connection points of semiconductive metal oxide form between the individual particles. While the particles applied in step (A) are generally only in tangential contact, larger connections are formed between the individual particles in step (B) of the process according to the invention.

Step (B) of the process according to the invention is generally performed at a temperature at which it is possible that the solution comprising at least one precursor compound of the at least metal oxide can penetrate at least partly into the pores of the porous layer obtained in step (A), for example 5 to 120° C., preferably 10 to 60° C., more preferably at room temperature.

Step (B) of the process according to the invention can generally be effected by all processes known to those skilled in the art, for example spin-coating, spray-coating, dip-coating, drop-casting or printing, for example inkjet printing, flexographic printing or gravure printing, of the precursor compound onto the substrate coated in (A).

The present invention therefore also relates to the process according to the invention wherein the treatment of the porous layer from step (A) is effected in step (B) by spin-coating, spray-coating, dip-coating, drop-casting or printing.

Step (B) can, in accordance with the invention, be performed continuously or batchwise.

The solution comprising at least one precursor compound of the at least one metal oxide in a solvent, which is used with preference in step (B) of the process according to the invention, may optionally comprise further additives, for example to improve the selected deposition operation onto the substrate (step B).

The solution used with preference in step (B) of the process according to the invention may additionally also comprise further metal cations which serve to dope the semiconductive metal oxide. In a particularly preferred embodiment, these metal cations are selected from the group consisting of $Al^{3+}$, $In^{3+}$, $Sn^{4+}$ and mixtures thereof. These may be introduced separately into the solution or may already be present in the inventive precursor compounds.

To prepare the solution, the dopant metal cations mentioned can be added in step (B) in the form of metal oxides, metal hydroxides, metal alkoxides or in the form of soluble complexes. The dopants mentioned can be added to the solution in step (B) of the process according to the invention generally in an amount of 0.1-10 mol % based on Zn, preferably 0.1-5 mol % based on Zn.

It is possible in accordance with the invention that dopants are used in steps (A) and (B), which may be the same or different. It is also possible in accordance with the invention that dopants are used only in step (A) or only in step (B). When dopants are used only in step (A), they are preferably present in the layer of at least one semiconductive metal oxide obtained in step (A). When dopants are used only in step (B), they are preferably present in the pores or interstices which are filled at least partly in step (B).

After step (B) of the process according to the invention, a substrate coated with a porous layer of at least one semiconductive metal oxide is generally obtained, and the pores of this layer are at least partly filled with a solution comprising at least one precursor compound of the semiconductive metal oxide.

Step (C):

Step (C) of the process according to the invention comprises the thermal treatment of the layer obtained in step (B) in order to convert the at least one precursor compound of the semiconductive metal oxide to the semiconductive metal oxide.

In a preferred embodiment of the process according to the invention, the thermal treatment in step (C) of the process according to the invention is effected at a temperature of 10 to 200° C., preferably 20 to 150° C., more preferably 30 to 130° C., most preferably 40 to 100° C.

The present invention therefore also relates to the process according to the invention wherein the thermal treatment in step (C) is effected at a temperature of 10 to 200° C.

In this case, it is advantageous in accordance with the invention that the specifically selected precursor compounds which are at least partly introduced into the pores in solution in step (B) can be converted to the corresponding metal oxide at relatively low temperatures. It is therefore possible to use, for example, polymer substrates, which are not deformed or thermally degraded owing to the low temperature during the production of the semiconductive metal oxide. A further advantage is that, owing to the precursor compounds used in the thermal treatment in step (C) of the process according to the invention, only volatile by-products form, which thus escape in gaseous form and do not remain as troublesome impurities in the layer formed.

In general, step (C) can be performed in all apparatus known to those skilled in the art for heating substrates, for example a hotplate, an oven, a drying cabinet, a hot air gun, a belt calciner or a thermostated cabinet.

In step (C), the at least one precursor compound of the semiconductive metal oxide, which has been introduced into the pores or interstices of the substrate with the solution or in step (B), is converted to the corresponding metal oxide, especially zinc oxide.

The precursor compounds used in accordance with the invention are generally converted in step (C) to the corresponding metal oxide, especially zinc oxide, and volatile compounds or mixtures thereof. More particularly, after the thermal treatment in step (C), no by-products of the precursor compounds, for example counterions such as halide anions, nitrate anions, cations such as $Na^+$ or $K^+$ or uncharged ligands, remain in the metal oxide layer formed.

A further advantage of the precursor compounds used in accordance with the invention is that they can be converted to the corresponding metal oxide in step (C) of the process according to the invention generally without addition of further additives, since they already have the oxygen needed for the conversion to the corresponding oxides in the ligand sphere. Since no further additives need be added, no by-products of these additives remain in the layer formed either. It is likewise advantageous that steps (A), (B) and (C) of the product process can be performed under ambient conditions (atmospheric oxygen, etc.).

After step (C) of the process according to the invention, in the case of low, plastic-compatible temperatures, a substrate coated with at least one semiconductive metal oxide is obtained, the pores of which are at least partly filled with semiconductive metal oxide. In addition, the particles which are preferably applied in step (A) are connected to one another in step (C), so as to result in a greater contact area between the individual particles. This operation can be described as "welding" or "filming". Instead of the tangential contact points which are present between the particles after step (A), larger connection sites are present between the particles after step (C).

It is also possible in accordance with the invention that a coated substrate obtained after step (C) is treated once or more than once more according to steps (B) and (C). It is thus possible to introduce more precursor compounds of the semiconductive metal oxide into the pores.

The present invention therefore also relates to the process according to the invention wherein the coated substrate obtained in step (C) is treated again according to steps (B) and (C). It is preferred in accordance with the invention that a total of 1 to 5, more preferably 1 to 3 and most preferably 1 or 2 treatment(s), each comprising step (B) and step (C), are carried out.

The present invention also relates to a process for producing a semiconductor component, for example a thin-film transistor TFT, comprising at least inventive steps (A), (B) and (C).

The inventive metal oxide precursor compounds are used to at least partly fill the pores of a porous layer of at least one semiconductive metal oxide, especially to at least partly fill the interstices of a semiconductive metal oxide particle layer and for better connection/"welding" of the metal oxide particles. This layer of at least one semiconductive metal oxide which has been treated in step (B) constitutes the semiconductor layer of a TFT. The solution of the precursor compound can be processed as described for steps (B) and (C).

With regard to the TFT architectures, such as bottom-gate, top-gate, top-contact, bottom-contact, etc., there are no restrictions. Dielectrics may be all possible or organic, inorganic or organic-inorganic hybrid materials. Gate, source and drain contact materials are conductive materials (e.g. Al, Au, Ag, Ti/Au, Cr/Au, ITO, Si, PEDOT/PSS etc.). Suitable substrates are especially also polymeric and flexible materials with low decomposition temperature, and other thermally labile substrates, without being restricted thereto. Substrate, gate, source and drain contact materials and dielectrics are not subject to any primary restrictions and can be selected according to chemical/physical compatibility, the processing operation and the desired use.

The present invention also relates to a substrate comprising a layer of at least one semiconductive metal oxide, obtainable by the process according to the invention. The details and preferred embodiments with regard to the substrates, the metal oxides, the precursor compound etc. have already been mentioned above.

Owing to the production process according to the invention, especially owing to the use of the specific precursor compounds for the semiconductive metal oxide, especially zinc oxide, the porous semiconductive metal oxide layers coated in steps (B) and (C) have improved electronic properties compared to the uncoated porous semiconductive metal oxide layers. In the case of a ZnO-TFT, the semiconductor layer of which consists of a ZnO nanorod film, comprising an Si (doped) gate, $SiO_2$ dielectric, aluminum source/drain contacts, the mobility of, for example, $1 \times 10^{-3}$ cm$^2$/Vs can be improved to, for example, $1 \times 10^{-2}$ cm$^2$/Vs when the ZnO nanorod film is treated in steps (B) and (C) with $[Zn(NH_3)4](OH)_2$ at a sintering temperature of 150° C. in step (C).

The present invention therefore also relates to the use of an inventive substrate in electronic components, for example TFTs, and to applications thereof in CMOS circuits and other electronic circuits, RFID tags, displays, etc. Processibility from solution at plastic-compatible temperatures makes component production possible on flexible, bendable substrates.

EXAMPLES

Example 1

Production of Nanorods 21.95 g of zinc acetate dihydrate (Honeywell) are dissolved at 60° C. in 942 ml of methanol (Fluka) in a 2 l four-neck flask. In parallel, in a 1 l bottle, 9.05 g of potassium hydroxide (Riedel-de-Haen) are dissolved in 516 ml of methanol at 60° C. When both solutions have the given temperature, they are combined with rapid stirring (425 rpm) and concentrated immediately on a rotary evaporator (oil bath temperature: 40° C.) to a volume of 200 ml. This solution is transferred to a 250 ml four-neck flask and stirred at 60° C. and 250 rpm for 16 h. Subsequently, the mixture is removed and transferred to a 1 l glass bottle. Overnight, ZnO settles out at the bottom, such that the supernatant methanol can be sucked out. The product is washed four times with 500 ml of methanol each time. In each washing operation, the ZnO is mixed thoroughly with fresh methanol on a magnetic stirrer for 40 minutes. After the last washing operation, the methanol is sucked out as far as possible and the ZnO is redispersed with 200 ml of dichloromethane. Subsequently, the solution is adjusted to a content of 4% by weight of zinc oxide by dilution. A portion of the solution comprising 2.344 g of zinc oxide is withdrawn. 0.52 g of monoethyl 3-oxoglutarate is added slowly with stirring on a magnetic stirrer at room temperature.

Example 2

Preparation of $[Zn(NH_3)_4](OH)_2$ as a Precursor Compound

A 500 ml four-neck flask is initially charged with 6.10 g of ZnO (pharmaceutical quality, Umicore). 500 ml of a 6.6 mol/l $NH_3/H_2O$ solution are added thereto. The suspension is stirred at 300 rpm at room temperature overnight. A clear solution with a small amount of suspended material is obtained, the latter being removed by means of a glass frit so as to obtain a clear solution of the complex specified. Elemental analysis of the solution shows a Zn content of 1.0 g/100 g solution.

Example 3

Use of the Solution from Example 2 as a Precursor Compound for Filling the Interstices and for Better Connection of ZnO Nanorods in a TFT with a Semiconductive ZnO Nanorod Layer An $Si_{doped}$ substrate with an $SiO_2$ dielectric layer (layer thickness: 200 nm) and with a ZnO nanorod layer from Example 1 obtained by spin-coating (layer thickness: 70 nm, nanorod diameter: ~10 nm, nanorod length: ~50 nm) is flooded with the solution from Example 2 which is applied by spin-coating at 3000 revolutions/min for 30 s. Subsequently, the sample is heated at 150° C. for 20 min. Source/drain contacts (channel width/length ratio: 20) are obtained by thermal vapor deposition of aluminum.

Figure 2:
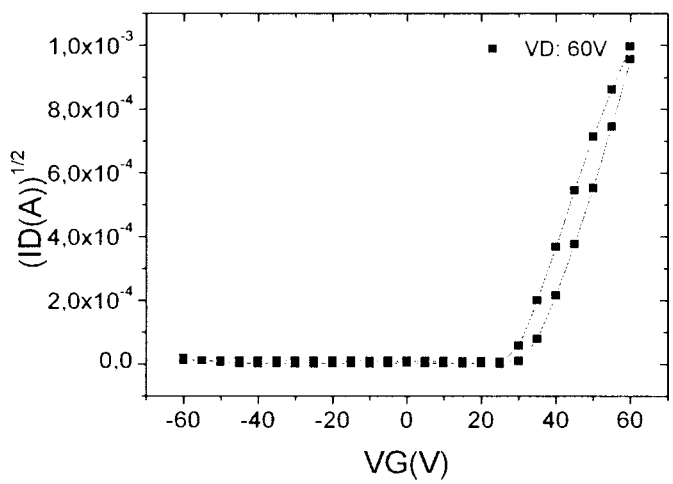
Figure 3:
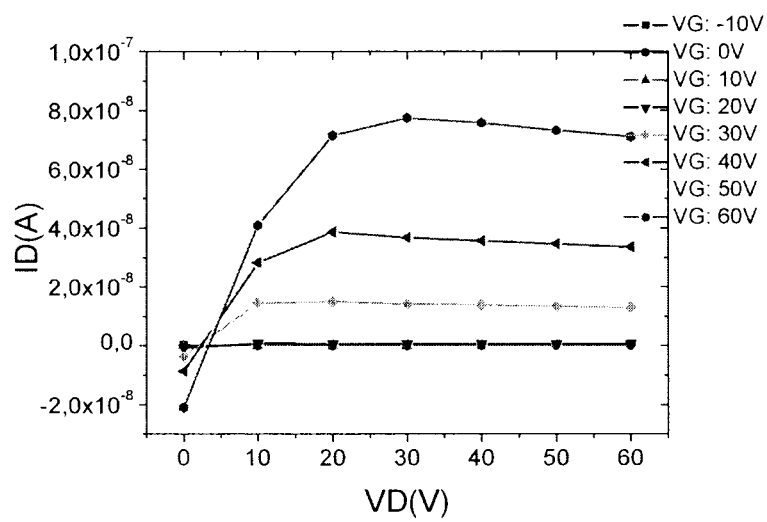
FIGS. 3 and 4 show representative output curves (OK) and transfer curves (TK) of a corresponding TFT without the inventive treatment with the solution from Example 2 (VD: voltage between source and drain, VG: voltage between source and gate, ID: current between source and drain).
Figure 4:
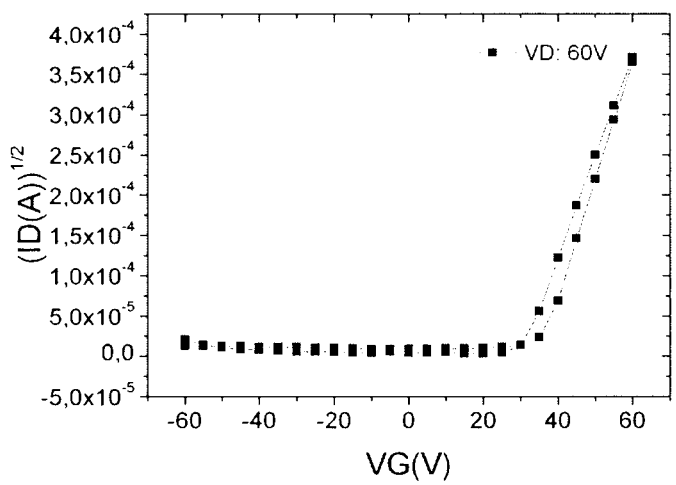

Representative output curves (OK) and transfer curves (TK) of the TFTs produced are depicted in FIGS. 1 and 2. For comparative purposes therewith, representative output curves (OK) and transfer curves (TK) of a corresponding TFT without the inventive treatment with the solution from Example 2 are depicted in FIGS. 3 and 4 (VD: voltage between source and drain, VG: voltage between source and gate, ID: current between source and drain).

The following average parameters are determined for an inventive TFT with $[Zn(NH_3)_4](OH)_2$ treatment:
mobility μ: $1*10^{-2}$ cm²/(V*s),
on/off ratio: $10^4$,
VT threshold voltage: 30 V.

The following average parameters are determined for a corresponding TFT without $[Zn(NH_3)_4](OH)_2$ treatment:
mobility μ: $1*10^{-3}$ cm²/(V*s),
on/off ratio: $10^4$,
VT threshold voltage: 30 V.

The invention claimed is:

1. A process for producing a layer comprising zinc oxide on a substrate, the process comprising:
    (A) applying a porous layer comprising zinc oxide to a substrate,
    (B) treating the porous layer of (A) with a solution comprising a precursor compound of zinc oxide, to at least partly fill pores of the porous layer with the solution, to obtain a solution-treated porous layer, and
    (C) thermally treating the solution-treated porous layer of (B) to convert the precursor compound to zinc oxide,
    wherein the precursor compound in (B) is at least one compound selected from the group consisting of the compound of the formula (III)

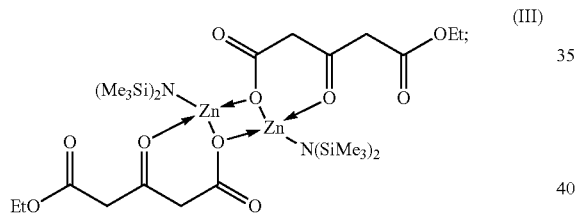
(III)

the compound of the formula (IV)

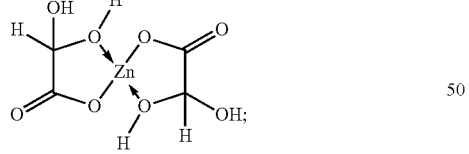
(IV)

the compound of the formula (IVa) $Zn[(NH_2CH_2COO)_2(H_2O)]$ with electron donor functionality

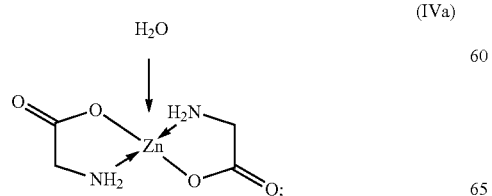
(IVa)

the compound of the formula (IVb)

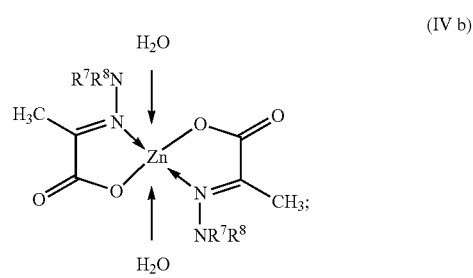
(IVb)

the compound of the formula (IVc)

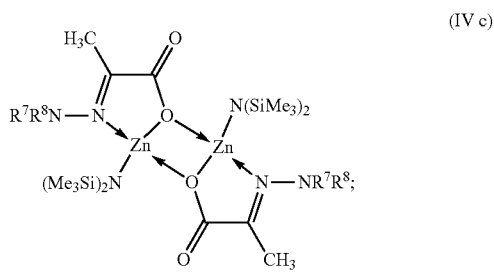
(IVc)

at least one zinc alkoxide of a formula selected from the group consisting of (Va), (Vb), and (Vc)

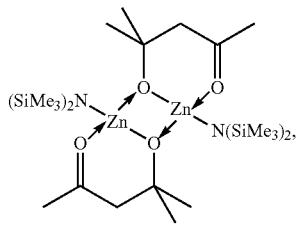
(Va)

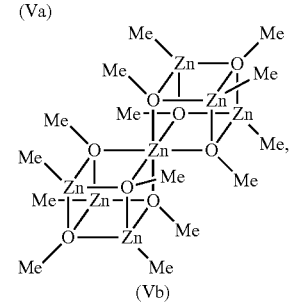
(Vb)

and

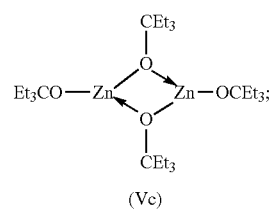
(Vc)

$[(OH)_x(NH_3)_yZn]_z$, wherein x=2, y and z are from 0.01 to 10; and
a mixture thereof.

2. The process of claim 1, wherein the porous layer of (A) comprises spherical particles, rod-shaped particles, platelet-shaped particles, or a mixture thereof.

3. The process of claim 2, wherein the spherical particles, rod-shaped particles, platelet-shaped particles, or the particles of the mixture thereof have an average diameter of from 3 nm to 1 µm.

4. The process of claim 1, wherein a temperature at which the solution-treated porous layer is thermally treated is from 10 to 200° C.

5. The process of claim 4, wherein the temperature at which the solution-treated porous layer is thermally treated is from 20 to 150° C.

6. The process of claim 1, wherein the zinc oxide of the porous layer applied in (A) is doped with at least one metal cation selected from the group consisting of $Al^{3+}$, $In^{3+}$, $Ga^{3+}$, and $Sn^{4+}$.

7. The process of claim 1, wherein the substrate comprises a polymer.

8. The process of claim 1, wherein the treating in (B) comprises spin-coating, spray-coating, dip-coating, drop-casting, printing, or a combination thereof.

9. The process of claim 1, wherein the solution further comprises a metal cation for doping the zinc oxide.

10. The process of claim 9, wherein the metal cation is at least one metal cation selected from the group consisting of $Al^{3+}$, $In^{3+}$, $Ga^{3+}$, and $Sn^{4+}$.

11. The process of claim 1, wherein the porous layer of (A) has a thickness of from 10 to 2000 nm.

12. The process of claim 1, wherein a content of precursor compound in the solution is from 0.01 to 20% by weight of the overall solution.

13. The process of claim 1, further comprising, after (C), repeating the treatment of the layer with the solution comprising a precursor compound and repeating the thermal treatment of the solution-treated porous layer.

14. The process of claim 13, comprising from 1 to 5 treatments, each comprising (B) and (C).

15. A process for producing a semiconductor component, comprising the process of claim 1.

* * * * *